(12) United States Patent
Clauss

(10) Patent No.: US 9,263,161 B2
(45) Date of Patent: Feb. 16, 2016

(54) OPTICAL ARRANGEMENT FOR EUV LITHOGRAPHY AND METHOD FOR CONFIGURING SUCH AN OPTICAL ARRANGEMENT

(75) Inventor: Wilfried Clauss, Ulm (DE)

(73) Assignee: Carl Zeiss SMT GmbH, Oberkochen, DE (US)

( * ) Notice: Subject to any disclaimer, the term of this patent is extended or adjusted under 35 U.S.C. 154(b) by 417 days.

(21) Appl. No.: 13/618,824

(22) Filed: Sep. 14, 2012

(65) Prior Publication Data

US 2013/0107239 A1 May 2, 2013

Related U.S. Application Data

(60) Provisional application No. 61/552,555, filed on Oct. 28, 2011.

(30) Foreign Application Priority Data

Oct. 28, 2011 (DE) .......................... 10 2011 085 358

(51) Int. Cl.
*G03B 27/72* (2006.01)
*G21K 1/06* (2006.01)
(Continued)

(52) U.S. Cl.
CPC ................. *G21K 1/062* (2013.01); *B82Y 10/00* (2013.01); *G02B 7/008* (2013.01); *G02B 17/0657* (2013.01); *G03F 7/70891* (2013.01); *G03F 7/70958* (2013.01); *G21K 2201/067* (2013.01)

(58) Field of Classification Search
CPC G02B 7/008; G02B 17/0657; G03F 7/70891; G03F 7/70958
USPC ........................................................ 355/71
See application file for complete search history.

(56) References Cited

U.S. PATENT DOCUMENTS 3,690,855 A 9/1972 Schultz
2003/0125184 A1 7/2003 Mitra
(Continued)

FOREIGN PATENT DOCUMENTS

DE 2140931 C3 1/1984
EP 1608598 B1 7/2007
(Continued)

OTHER PUBLICATIONS

Office Action in corresponding German Application No. 10 2011 085 358.8, dated Dec. 6, 2011, along with an English translation.
(Continued)

*Primary Examiner* — Peter B Kim
(74) *Attorney, Agent, or Firm* — Edell, Shapiro & Finnan, LLC

(57) ABSTRACT

An optical arrangement, e.g. projection lens, for EUV lithography, provided with: a first optical element (22) having a reflective surface (31*a*) and a first substrate (32) composed of $TiO_2$-doped quartz glass, which has a temperature-dependent coefficient of thermal expansion having a zero crossing at a first zero crossing temperature ($T_{ZC1}$), and a second optical element (24) having a reflective surface (36*a*) and a second substrate (37) composed of $TiO_2$-doped quartz glass, which has a temperature-dependent coefficient of thermal expansion having a zero crossing at a second zero crossing temperature ($T_{ZC2}$), which is different from the first. A gradient of the coefficient of thermal expansion of the first substrate (32) at the first zero crossing temperature ($T_{ZC1}$) and/or a gradient of the coefficient of thermal expansion of the second substrate (37) at the second zero crossing temperature ($T_{ZC2}$) have/has a negative sign.

18 Claims, 3 Drawing Sheets

(51) Int. Cl.
*G02B 7/00* (2006.01)
*G02B 17/06* (2006.01)
*G03F 7/20* (2006.01)
*B82Y 10/00* (2011.01)

(56) References Cited

U.S. PATENT DOCUMENTS

| | | | |
|---|---|---|---|
| 2005/0207001 A1* | 9/2005 | Laufer et al. | 359/350 |
| 2007/0035814 A1 | 2/2007 | Dinger et al. | |
| 2007/0085043 A1 | 4/2007 | Leonardus Franken et al. | |
| 2007/0091420 A1* | 4/2007 | Hosoya et al. | 359/359 |
| 2007/0207911 A1 | 9/2007 | Koike et al. | |
| 2008/0004169 A1 | 1/2008 | Ellison | |
| 2009/0066924 A1 | 3/2009 | Franken et al. | |
| 2009/0242387 A1 | 10/2009 | Koike et al. | |
| 2010/0195075 A1 | 8/2010 | Chan et al. | |
| 2010/0323871 A1 | 12/2010 | Koike et al. | |
| 2011/0048075 A1 | 3/2011 | Duran et al. | |
| 2011/0052869 A1 | 3/2011 | Hrdina et al. | |
| 2011/0181851 A1 | 7/2011 | Schoeppach et al. | |

FOREIGN PATENT DOCUMENTS

| | | |
|---|---|---|
| JP | 2003303750 A | 10/2003 |
| JP | 2006103988 | 4/2006 |
| JP | 2006156215 A | 6/2006 |
| JP | 2006194690 A | 7/2006 |
| JP | 2006210404 A | 8/2006 |
| JP | 2007123874 A | 5/2007 |
| JP | 2007524214 A | 8/2007 |
| JP | 2010163345 A | 7/2010 |
| JP | 2010251801 | 11/2010 |
| JP | 2010537413 A | 12/2010 |
| JP | 2012503319 A | 2/2012 |
| WO | 2004015477 A1 | 2/2004 |
| WO | 2004089839 A1 | 10/2004 |
| WO | 2010031526 A1 | 3/2010 |

OTHER PUBLICATIONS

English language translation of Office Action in corresponding Japanese Application No. 2012-136845, dated Oct. 2, 2012.

English language translation of Office Action in corresponding Japanese Application No. 2012-136845, dated Apr. 23, 2013.

Office Action in corresponding German Application No. 10 2011 085 358.8, dated Feb. 29, 2012, along with an English translation.

English language translation of Office Action in corresponding Japanese Application No. 2012-136845, dated Oct. 25, 2013.

* cited by examiner

OPTICAL ARRANGEMENT FOR EUV LITHOGRAPHY AND METHOD FOR CONFIGURING SUCH AN OPTICAL ARRANGEMENT

FIELD OF AND BACKGROUND OF THE INVENTION

The invention relates to an optical arrangement for EUV lithography, in particular a projection lens, and to a method for configuring such an optical arrangement.

Materials which are used as substrates for reflective optical elements in EUV lithography on account of the extremely stringent requirements made of geometrical tolerances and stability which exist particularly in projection lenses of EUV lithography apparatuses, are permitted to have only a very low coefficient of thermal expansion (CTE) in the temperature range used there. The substrate materials used there typically comprise two constituents, the coefficients of thermal expansion of which have a mutually opposite dependence on temperature, such that the coefficients of thermal expansion mutually compensate for one another virtually completely in the range of the operating temperature.

A first group of materials that meets the stringent requirements of the CTE for EUV applications comprises doped silicate glasses, e.g. silicate or quartz glass doped with titanium dioxide, which typically has a silicate glass proportion of more than 80%. One such silicate glass that is commercially available is sold by Corning Inc. under the trade name ULE® (Ultra Low Expansion glass). $TiO_2$-doped quartz glass can, if appropriate, also be doped with further materials, e.g. with materials that reduce the viscosity of the glass, as is presented e.g. in US 2008/0004169 A1, wherein alkali metals are used, inter alia, in order to reduce the effects of striae in the glass material.

A second group of materials suitable as substrates for EUV mirrors comprises glass ceramics, in which the ratio of the crystal phase to the glass phase is set such that the coefficients of thermal expansion of the different phases virtually cancel one another out. Such glass ceramics are offered e.g. under the trade name Zerodur® from Schott AG or under the trade name Clearceram® from Ohara Inc.

The dependence of the thermal expansion (change in length) of the above-described materials on temperature is parabolic in the relevant temperature range, that is to say that there exists an extremum of the thermal expansion at a specific temperature. The derivative of the thermal expansion of zero expansion materials with respect to temperature, i.e. the coefficient of thermal expansion, is approximately linearly dependent on temperature in this range and changes sign at the temperature at which the thermal expansion is extremal, for which reason this temperature is designated as zero crossing temperature. Consequently, the thermal expansion is minimal only for the case where the operating or working temperature of the substrate coincides with the zero crossing temperature. In the case of small deviations from the zero crossing temperature, although the coefficient of thermal expansion is still low, it increases further with increasing temperature difference with respect to the zero crossing temperature.

It is known that the zero crossing temperature of $TiO_2$-doped quartz glass can be altered by the setting of the titanium dioxide proportion during the production of the quartz glass (at temperatures above the softening point). In the case of conventional $TiO_2$-doped quartz glass, the gradient of the coefficient of thermal expansion in the vicinity of the zero crossing temperature typically lies in the range of between approximately 1 ppb/$K^2$ and 3 ppb/$K^2$.

It is known from US 2011/0048075 A1 that the zero expansion temperature of $TiO_2$-doped quartz glass (without exceeding the softening point) can be set to a specific value within a predefined range of values by means of a final heat treatment step. In this way, a plurality of substrates having different zero expansion temperatures can be produced from partial volumes of one and the same boule (quartz glass block having an (approximately) constant $TiO_2$ proportion). The temperature range within which the zero expansion temperature is intended to be able to be set by means of the additional heat treatment step is approximately +/−10° C. or approximately +/−5° C. The gradient of the coefficient of thermal expansion in the vicinity of the zero expansion temperature is intended not to vary or to vary only slightly in this case.

It is likewise known that through a suitable choice of the temperature/time curve during a heat treatment process for the glass, the fictive temperature of the glass and thus not only the zero crossing temperature but also the gradient of the coefficient of thermal expansion at the zero crossing temperature can be set. Thus, by way of example DE 21 40 931 C3 has disclosed a method for setting the coefficient of thermal expansion of a $TiO_2$—$SiO_2$ glass consisting of 12% (by weight) to 20% (by weight) $TiO_2$, wherein the sign of the coefficient of thermal expansion can be changed from negative to positive by subjecting the glass to a thermal treatment at a temperature of from 700 to approximately 900° C.

Given a high $TiO_2$ content of the quartz glass of e.g. more than 10%, the problem can occur that there is a tendency for Ti-rich particles to crystallize out, which can adversely influence the polishability of the quartz glass. US 2011/0052869 A1 discloses applying, to a quartz glass base body having high $TiO_2$-doping (10% or more) a layer composed of a more weakly doped quartz glass, which can be polished to a higher surface quality than the quartz glass base body.

EP 1 608 598 B1 has disclosed a $TiO_2$-containing quartz glass which is intended to have a fictive temperature of at most 1200° C., a concentration of OH groups of at most 600 ppm and a coefficient of thermal expansion of 0+/−200 ppb/K between 0° C. and 100° C. During production, the quartz glass is held for a predetermined time period at a temperature which exceeds 500° C., and the temperature is subsequently decreased at an average cooling rate of at most 10° C./h to 500° C.

US 2007/0035814 describes a projection lens for wavelengths of less than 157 nm, which comprises at least two optical elements composed of different materials, which differ in the region of the zero expansion temperature in terms of the gradient, more particular in terms of the sign of the gradient of the coefficient of thermal expansion. Examples of the different materials specified include firstly glass ceramics, in particular Zerodur®, and secondly amorphous titanium silicate glass, in particular ULE®.

WO 2004/015477 A1 discloses setting the zero crossing temperature in the material of an optical component such that this substantially (except for approximately +/−3 K) corresponds to a maximum temperature to which the optical component is heated. Image aberrations of an optical system are intended to be minimized in this way. US 2003/0125184 describes a method for producing a glass ceramic having a zero crossing temperature that deviates from a desired temperature by at most +/−10° C.

OBJECTS AND SUMMARY OF THE INVENTION

It is an object of the invention to provide an optical arrangement for EUV lithography, in particular a projection lens, and a method for configuring such an optical arrangement with optical elements in which temperature-dictated deformations are reduced.

This object is achieved by an optical arrangement for EUV lithography, in particular a projection lens, comprising: a first optical element, which comprises a surface that reflects EUV radiation and a first substrate composed of $TiO_2$-doped quartz glass, which has a temperature-dependent coefficient of thermal expansion having a zero crossing at a first zero crossing temperature, and a second optical element, which comprises a surface that reflects EUV radiation and a second substrate composed of $TiO_2$-doped quartz glass, which has a temperature-dependent coefficient of thermal expansion having a zero crossing at a second zero crossing temperature, which is different from the first, wherein a gradient of the coefficient of thermal expansion of the first substrate at the first zero crossing temperature and/or a gradient of the coefficient of thermal expansion of the second substrate at the second zero crossing temperature have/has a negative sign.

The invention proposes equipping at least two optical elements of an optical arrangement, for example of a projection lens for microlithography, with a substrate composed of $TiO_2$-doped quartz glass material having a different zero crossing temperature, wherein the coefficient of thermal expansion at the respective zero crossing temperature has a negative sign in the case of at least one of the substrates. In this way, the substrate material of a respective optical element can be individually adapted to the ambient conditions under which the optical element is operated. In particular, the substrate material or the zero crossing temperature can be chosen in a manner dependent on the operating temperature of the optical element in the optical arrangement.

The different zero crossing temperatures in the substrate materials can be produced, for example, by a different $TiO_2$ proportion being set during the production of the quartz glass and/or by one or a plurality of heat treatment steps being carried out in order to suitably modify the zero crossing temperature of the quartz glass material after cooling below the softening point, i.e. typically to adapt it to the respective working temperature during the operation of the optical element in the optical arrangement.

In one embodiment, the gradient of the coefficient of thermal expansion of the first substrate at the first zero crossing temperature and the gradient of the coefficient of thermal expansion of the second substrate at the second zero crossing temperature differ in terms of sign. The use of substrates having a different sign of the gradient of the coefficient of thermal expansion makes it possible to increase the performance of the optical arrangement, in particular of a projection lens, since image aberrations, or aberrations can be reduced in this way.

In a further embodiment, the absolute value of the gradient of the coefficient of thermal expansion of the first substrate at the first zero crossing temperature and/or the absolute value of the gradient of the coefficient of thermal expansion of the second substrate at the second zero crossing temperature are/is less than $1.0$ ppb/$K^2$, preferably less than $0.5$ ppb/$K^2$, in particular less than $0.2$ ppb/$K^2$. The gradient of the CTE of both substrates is expediently less than $1.0$ ppb/$K^2$. As already explained further above, the gradient of the CTE can be modified by heat treatment processes with suitably chosen parameters, such that it is possible to achieve an absolute value of the gradient which lies below the values indicated above.

In one embodiment, the absolute value of the difference between the first zero crossing temperature and the second zero crossing temperature is more than 6 K, preferably more than 10 K. Such an absolute value of the difference in the zero crossing temperatures of the coefficients of thermal expansion of the substrate materials has proved to be advantageous since the operating temperatures of the optical elements e.g. in a projection lens typically differ at least by said absolute value. In the case of more than two optical elements being present in an optical arrangement, the above condition should be met at least for two of the optical elements provided therein.

In one embodiment, the $TiO_2$ content of the first substrate differs from the $TiO_2$ content of the second substrate. The zero crossing temperature of the glass can admittedly be set within certain limits during heat treatment; in order, however, to bring about a significant difference in the zero crossing temperatures, or more particularly in order to bring about a gradient of the CTE having a different sign in each case, substrate materials whose $TiO_2$ content differs from one another are typically required.

In one embodiment, the first substrate has a $TiO_2$ proportion of between 8% by weight and 12% by weight, preferably between 8% by weight and 10% by weight. In the case of a $TiO_2$ proportion within this interval, a positive gradient of the CTE (with increasing temperatures) usually occurs at the zero crossing temperature. The increased $TiO_2$ proportion of the substrate generally leads to a comparatively high zero crossing temperature (of 40° C. or more) and can be shifted to lower temperatures by a suitable heat treatment process with a slow cooling rate, the gradient of the CTE also being reduced to the desired value at the same time. For this purpose, it is of advantage to attain a low fictive temperature of less than 780° C. (cf. EP1608598 cited in the introduction). Carrying out a heat treatment process with an initial temperature of 950-1050° C. and with a cooling rate in the range of 0.1° C.-2° C./h has proved to be particularly advantageous in this case.

In a further embodiment, the second substrate has a $TiO_2$ content of more than 12%, in particular of approximately 15% or more. A quartz glass material having such a $TiO_2$ content, at the temperatures relevant here, typically firstly has a high negative gradient at the zero crossing temperature, or a negative gradient can be produced by the thermal treatment indicated in DE 21 40 931 C3 cited in the introduction. In one or a plurality of subsequent heat treatment steps, the absolute value of the (negative) gradient at the zero crossing temperature can then be shifted to smaller values, as described, e.g. in DE 2140931 C3. By way of example, in order to reduce the gradient of the CTE, a heat treatment step can be effected wherein slow cooling at a rate of approximately 1° C. to approximately 2° C./h is effected proceeding from a temperature in the range of between approximately 750° C. and 850° C. The parameters in this heat treatment step should be chosen so as to result in a remaining negative gradient of less than —1 ppb/$K^2$. A plurality of heat treatment steps with a slow cooling rate may possibly be necessary in order to achieve this or possibly an even lower absolute value of the gradient of the CTE. During these slow heat treatment steps, the zero crossing temperature, which is in the range above 0° C., typically does not vary or varies only slightly.

In a further embodiment, both the first and the second zero crossing temperature lie in a temperature range of between 0° C. and 100° C., preferably between 10° C. and 60° C., particularly preferably between approximately 20° C. and approximately 40° C. The zero crossing temperatures of the substrate materials should be in the range of the operating temperatures of the optical elements in the optical arrangement or slightly below or above them. The optical elements are typically not cooled, and so generally the minimum operating temperature corresponds to room temperature (approximately 22° C.). The maximum operating temperature of optical elements e.g. in a projection lens is dependent, inter alia, on the radiation power of the EUV radiation used and typically varies in a range up to approximately 30° C. or up to approximately 40° C.

In order to achieve a sufficient reflectivity of optical elements for EUV lithography, it can suffice if a metal or a metallic layer (in particular composed of ruthenium) is applied to the substrate, provided that the respective optical element is operated at large angles of incidence of more than 45° or at very large angles of incidence of more than 70°. At smaller angles of incidence of less than approximately 45°, a reflective multilayer coating is applied to the first and/or to the second substrate, the reflective surface being formed at said coating. The reflective coating generally has a plurality of alternating layers composed of high and low refractive index materials, e.g. alternating layers composed of molybdenum and silicon, the layer thicknesses of which are coordinated with one another such that the coating fulfils it optical function and a high reflectivity is ensured. The multilayer coating typically additionally has a capping layer in order to protect the underlying layers against oxidation or other degradation mechanisms. Said capping layer can consist of a metallic material, e.g. of ruthenium, rhodium or palladium.

In one development, at least one functional, in particular polishing-simplifying, layer is fitted between the first and/or the second substrate and the reflective coating. The functional layer can, for example, likewise be produced from $TiO_2$-doped quartz glass having a smaller $TiO_2$ proportion than the substrate, e.g. a $TiO_2$ content of between approximately 5% by weight and approximately 8% by weight or at most approximately 10% by weight, since a glass material having a smaller $TiO_2$ proportion can be polished more easily for the application of the reflective coating. Alternatively or additionally, in order to avoid irradiation-induced degradation effects (in particular compacting) it is also possible to apply other functional layers, e.g. composed of highly absorbent materials, in particular nickel.

A further embodiment additionally comprises at least one heating device for heating at least one substrate, and a control device for driving the at least one heating device for setting the temperature of the at least one substrate to a working temperature. Since the temperature of the substrate or of the reflective surface in a projection lens is dependent, inter alia, on the illumination settings, it has proved to be advantageous to control the temperature of the substrate to a working temperature by open-loop or closed-loop control. By way of example, Peltier elements, heating wires, radiation sources, etc. can serve as heating devices. In order to control the temperature to the working temperature by closed-loop control, one or a plurality of temperature sensors can be provided on the heated optical element or on the substrate. The working temperature to which the substrate is heated can be chosen, in particular, such that it corresponds (at least) to the maximum temperature which occurs at the reflective surface of the optical element during the operation of the optical arrangement.

In one development, the working temperature deviates from the zero crossing temperature of the substrate by less than 3 K, preferably by less than 2 K, in particular by less than 1 K. Ideally, the working temperature corresponds to the zero crossing temperature. If the working temperature is very close to the zero crossing temperature and if the gradient of the coefficient of thermal expansion is very small (less than 1.0 ppb/$K^2$), the deformations of the substrate and thus in particular also the deformations of the optical surface are small, which has an advantageous effect on the overall performance of the optical arrangement or of the projection lens.

The invention also relates to a method for configuring an optical arrangement for EUV lithography, in particular a projection lens, wherein the optical arrangement comprises at least two optical elements having a surface that reflects EUV radiation, and having a substrate composed of $TiO_2$-doped quartz glass, the method comprising: selecting a substrate material for the optical elements from a first or a second group of substrates composed of $TiO_2$-doped quartz glass, wherein the first group has a temperature-dependent coefficient of thermal expansion having a zero crossing at a first zero crossing temperature, and wherein the second group has a coefficient of thermal expansion having a zero crossing at a second zero crossing temperature, which is different from the first, and wherein a gradient of the coefficient of thermal expansion of the first group of substrates at the first zero crossing temperature and/or a gradient of the coefficient of thermal expansion of the second group of substrates at the second zero crossing temperature have/has a negative sign.

For the configuration of the optical arrangement it is proposed to keep available at least two different groups or batches of substrates, wherein the substrates of a respective group are produced in the same production process or a production process of identical type and therefore have an identical $TiO_2$ proportion. By way of example, the substrates of a group can originate from the partial volume of one and the same boule (quartz glass block).

In one variant of the method, selecting the substrate material is effected in a manner dependent on the position of a respective optical element in the optical arrangement. Since in each case only approximately 60% of the incident EUV radiation is reflected at a respective optical element, the radiation power or the power density of the radiation impinging on a respective optical element is dependent on the position thereof in the optical arrangement. To put it more precisely, the impinging power density and thus also the operating temperature of the optical element depend, inter alia, on how many optical elements are situated between the radiation source and the position of the optical element.

In one variant, the first group of substrates at the first zero crossing temperature has a gradient of the coefficient of thermal expansion whose sign differs from the gradient of the coefficient of thermal expansion of the second group of substrates at the second zero crossing temperature. It has proved to be advantageous if both groups of substrates differ in terms of the sign of the coefficient of thermal expansion. In this case, a first group of substrates, which has a positive gradient of the coefficient of thermal expansion, typically has a zero crossing temperature which, for example, is approximately of the same magnitude as, or greater than, the maximum expected operating or working temperature of the substrates or of the reflective surfaces of the optical elements in the optical arrangement. This has proved to be advantageous since, using a suitable heat treatment process (see below) the zero crossing temperature can be shifted to lower values, such that the substrate material of the first group can be flexibly adapted to the working temperatures of different optical elements. By contrast, a second group of substrates has a negative gradient at the zero expansion temperature. The absolute value of the gradient of the CTE at the respective zero crossing temperature of a respective group of substrate materials should have a value that is as small as possible, this value preferably not being greater than 1.6 ppb/$K^2$.

In particular, in this case, the $TiO_2$ content of the first group of substrate materials can differ from the $TiO_2$ content of the second group of substrate materials, i.e. both groups are produced in different production processes or belong to different boules. In this case, the $TiO_2$ proportion of the quartz glass material of the respective group can assume, in particular, the values indicated above in connection with the optical arrangement.

In a further variant, the method additionally comprises the steps of: performing a heat treatment of the selected substrate for changing the zero crossing temperature to a desired zero crossing temperature for the optical element and/or for reducing the gradient of the coefficient of thermal expansion to an absolute value of less than 1.0 ppb/$K^2$, preferably of less than 0.5 ppb/$K^2$, in particular of less than 0.2 ppb/$K^2$, at the desired zero crossing temperature of the optical element. The additional heat treatment makes it possible to adapt the zero crossing temperature of the selected substrate to the working temperature provided for the respective optical element, and/or to reduce the absolute value of the gradient of the CTE. In general, before the additional heat treatment, the geometry of the substrate or of the blank is adapted to the geometry of the respectively assigned optical element by the selected substrate being suitably cut to size. Since the maximum permissible gradient of the CTE is likewise dependent on the respective position of the optical element in the optical arrangement, a plurality of heat treatment steps may possibly be necessary until the desired value for the gradient is attained.

In one variant, the (additional) heat treatment comprises: heating the selected substrate to a holding temperature of at least 750° C., preferably of at least 800° C., holding the substrate at the holding temperature for at least 40 hours, and cooling the substrate at a cooling rate of between 0.1 K/h and 5.0 K/h in a temperature range between the holding temperature and 500° C. Such a heat treatment step at a slow cooling rate has proved to be advantageous for shifting the zero crossing temperature of the selected substrate to lower temperatures and in this way adapting it to the desired working temperature. During the heat treatment process, a fictive temperature is intended to be established which is less than 800° C. and which is thus lower than the lowest fictive temperature of 840° C. as specified in EP 1 608 598 B1 (Example 4). In the case where a specific temperature, e.g. 500° C., is undershot, cooling to room temperature is typically effected without control of the cooling rate (i.e. by leaving the substrate to stand).

Further features and advantages of the invention are evident from the following description of exemplary embodiments of the invention, with reference to the figures of the drawing, which show details essential to the invention, and from the claims. The individual features can each be realized individually by themselves or as a plurality in any desired combination in a variant of the invention.

BRIEF DESCRIPTION OF THE DRAWINGS

Exemplary embodiments are illustrated in the schematic drawing and are explained in the following description. In the figures.

DETAILED DESCRIPTION OF EXEMPLARY EMBODIMENTS

Figure 1:
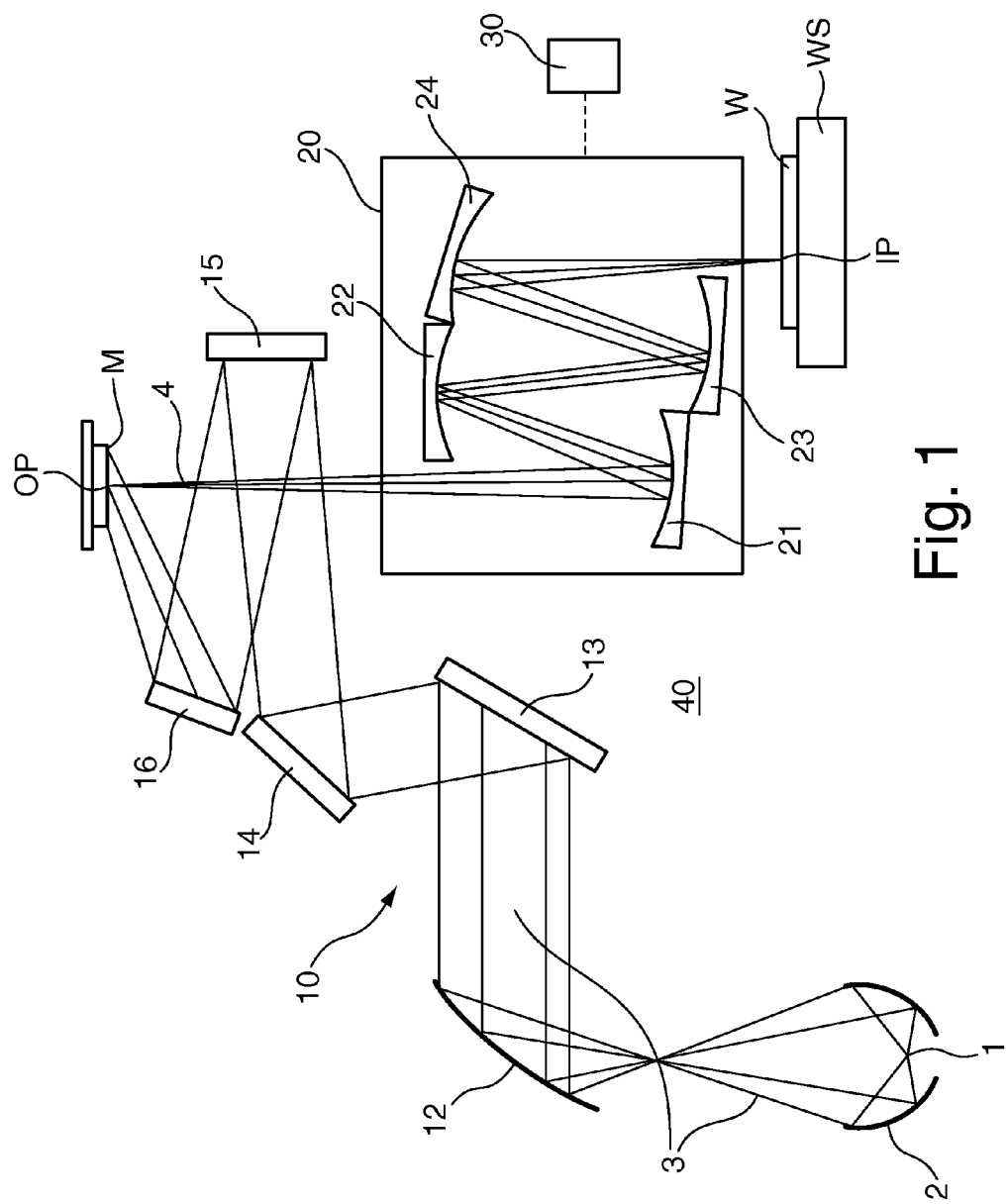
FIG. 1 shows a schematic illustration of an EUV lithography apparatus comprising a projection lens having four reflective optical elements, FIGS. 2a,b show schematic illustrations of a first and second reflective optical element, respectively, of the projection lens from FIG. 1, which are operated at different working temperatures, and FIGS. 3a,b show schematic illustrations of the temperature-dependent coefficient of thermal expansion of a first and second $TiO_2$-doped quartz glass substrate for the first and second optical elements.

FIG. 1 schematically shows an EUV lithography apparatus 40. The latter comprises an EUV light source 1 for generating EUV radiation, which has a high energy density in an EUV wavelength range of below 50 nm, more particularly between approximately 5 nm and approximately 15 nm. The EUV light source 1 can be embodied, for example, in the form of a plasma light source for generating a laser-induced plasma or as a synchrotron radiation source. Particularly in the former case, as shown in FIG. 1, a collector mirror 2 can be used in order to concentrate the EUV radiation from the EUV light source 1 to form an illumination ray 3 and to increase the energy density further in this way. The illumination ray 3 serves for illuminating a structured object M with an illumination system 10, which comprises four reflective optical elements 13 to 16 in the present example.

The structured object M can be a reflective mask, for example, which has reflective regions and non-reflective regions or regions that reflect at least to a lesser extent, for producing at least one structure on the object M. Alternatively, the structured object M can be a plurality of micromirrors which are arranged in a one- or multidimensional arrangement and which, if appropriate, are movable about at least one axis in order to set the angle of incidence of the EUV radiation 3 on the respective mirror.

The structured object M reflects part of the illumination ray 3 and shapes a projection ray 4, which carries the information about the structure of the structured object M and which is radiated into a projection lens 20, which generates an imaging of the structured object M or of a respective partial region thereof on a substrate W. The substrate W, for example a wafer, comprises a semiconductor material, e.g. silicon, and is arranged on a mount, which is also designated as the wafer stage WS.

In the present example, the projection lens 20 comprises four reflective optical elements 21 to 23 (mirrors) in order to generate an image of the structure present on the structured object M on the wafer W. The number of mirrors in a projection lens 20 is typically between four and eight, but if appropriate it is also possible to use just two mirrors.

In order to achieve a high imaging quality during the imaging of a respective object point OP of the structured object M onto a respective image point IP on the wafer W, extremely stringent requirements have to be made of the surface shape of the mirrors 21 to 24 and the position or the orientation of the mirrors 21 to 24 with respect to one another or relative to the object M and to the substrate W also requires a precision in the nanometers range.

During the operation of the projection lens 20, the problem occurs that a proportion of the radiation of the projection ray 4, which can amount to up to approximately 30%, is absorbed by a respective optical element 21 to 24. Depending on the quantity of absorbed radiation, in a respective mirror 21 to 24 heating and, as a result, thermal expansion occurs, which leads to deformations of the reflective surfaces of the respective mirrors 21 to 24 which alter the orientation or the surface shape of the mirrors 21 to 24 in an undesirable manner. One possibility for combating this problem is to use an open-loop or closed-loop control device 30 for setting the temperature of the individual mirrors 21 to 24. However, even when such a control device 30 is provided, it is necessary to provide the mirrors 21 to 24 with a substrate material having a coefficient of thermal expansion which is as low as possible and which has an absolute value of less than 2 ppb/K in the relevant temperature range of e.g. 20° C. to 40° C. In this way, changes in the expansion of the respective substrate that are caused by fluctuations of the temperature can be kept small.

Figure 2A:
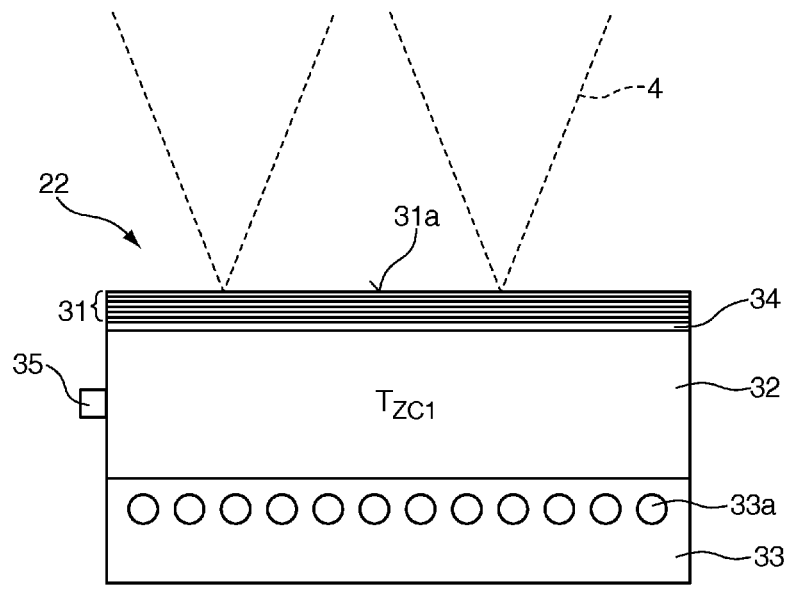

In the case of the projection lens 20 shown in FIG. 1, all four mirrors 21 to 24 comprise $TiO_2$-doped quartz glass as substrate material. FIG. 2a shows by way of example the second mirror 22 of the projection lens 20 in a schematic illustration. The second mirror 22 comprises a substrate 32, the $TiO_2$ proportion of which is more than 8% by weight and is typically not more than 12% by weight.

A reflective coating 31 is applied to the substrate 32, said reflective coating having a plurality of individual layers (not designated more specifically) that alternately consist of materials having different refractive indices. If EUV radiation at a wavelength in the region of 13.5 nm is used in the projection lens 20, then the individual layers usually consist of molybdenum and silicon. Other material combinations such as e.g. molybdenum and beryllium, ruthenium and beryllium or lanthanum and $B_4C$ are likewise possible. In addition to the individual layers, a reflective coating can also comprise intermediate layers for preventing diffusion and a capping layer for preventing oxidation or corrosion. The top side of the reflective coating 31 is designated hereinafter as reflective surface 31a, even though strictly speaking the reflective coating 31 as a whole effects the reflection of the EUV radiation.

An intermediate layer 34 (functional layer) is introduced between the substrate 32 and the reflective coating 31, which layer simplifies polishing of the surface of the substrate 32 before the reflective coating 31 is applied. In the present example, the intermediate layer 34 is formed from $TiO_2$-doped quartz glass which has a lower $TiO_2$ proportion (e.g. of approximately 5% by weight) than the underlying substrate 32, and which can therefore be polished more easily than the substrate 32.

Figure 3A:
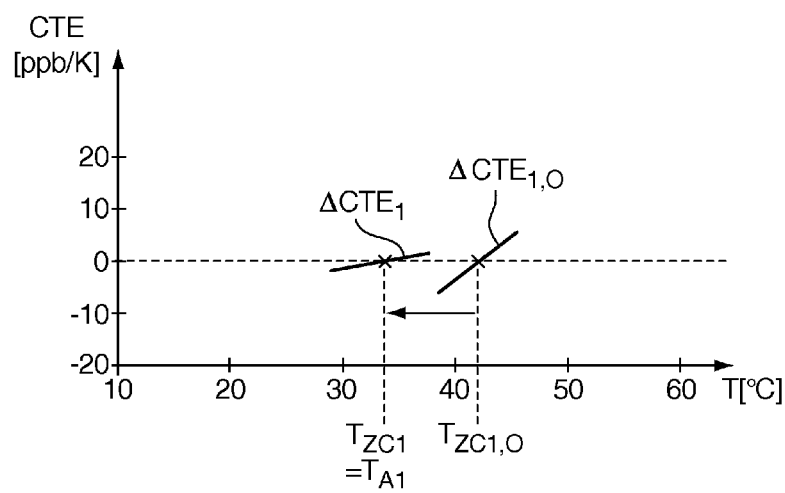

The substrate 32 is applied to a carrier 33, in which a plurality of heating elements 33a in the form of Peltier elements are provided, which serve for homogeneously heating the substrate 32 to a working temperature $T_{A1}$ (cf. FIG. 3a). In order to obtain the working temperature $T_{A1}$ even in the case of a temporally variable intensity of the projection ray 4 on the reflective surface 31a of the optical element 22, the control device 30 shown in FIG. 1 is used, which serves for driving the heating device 33a. In order to control the temperature of the substrate 32 to the working temperature $T_{A1}$ by closed-loop control, a temperature sensor 35 is provided laterally on the substrate 32, said temperature sensor being connected to the control device 30 via a connecting line (not shown). The control device 30 can also be used for the closed-loop control or for the open-loop control of the temperature of further optical elements 21, 23, 24 of the projection lens 20.

In the example shown in FIG. 2a and FIG. 3a, the working temperature of the substrate 32 is $T_{A1}=33°$ C. In order to avoid deformations caused by temperature fluctuations and/or a shift in the entire reflective surface 31a as a result of a change in the length of the substrate 32, it is advantageous if the working temperature $T_{A1}$ of the optical element 22 corresponds as exactly as possible to the zero crossing temperature $T_{ZC1}$ of the coefficient of thermal expansion of the substrate 32 (cf. FIG. 3a). In order that only a smallest possible change in the length of the substrate 32 is obtained even in the case of deviations of the working or operating temperature $T_{A1}$ of the optical element 22 from the zero crossing temperature $T_{ZC1}$, the (positive) gradient $\Delta CTE_1$ of the coefficient of thermal expansion CTE at the zero crossing temperature $T_{ZC1}$ should be as small as possible and be less than 1.0 ppb/$K^2$, preferably less than 0.5 ppb/$K^2$, in particular less than 0.2 ppb/$K^2$. However, even in the case of a small gradient $\Delta CTE_1$, the difference between the working temperature $T_{A1}$ and the zero crossing temperature $T_{ZC1}$ should be less than 3 K, that is to say that $|T_{A1}-T_{ZC1}|<3$ K should hold true.

In this case, a linear relationship between the coefficient of thermal expansion CTE and the gradient $\Delta CTE_1$ was assumed, to be precise according to the following formula:

$$CTE(T)=\Delta CTE_1(T-T_{ZC1}).$$

This relationship strictly speaking applies only in the case of small deviations from the zero crossing temperature $T_{ZC1}$.

Figure 2B:
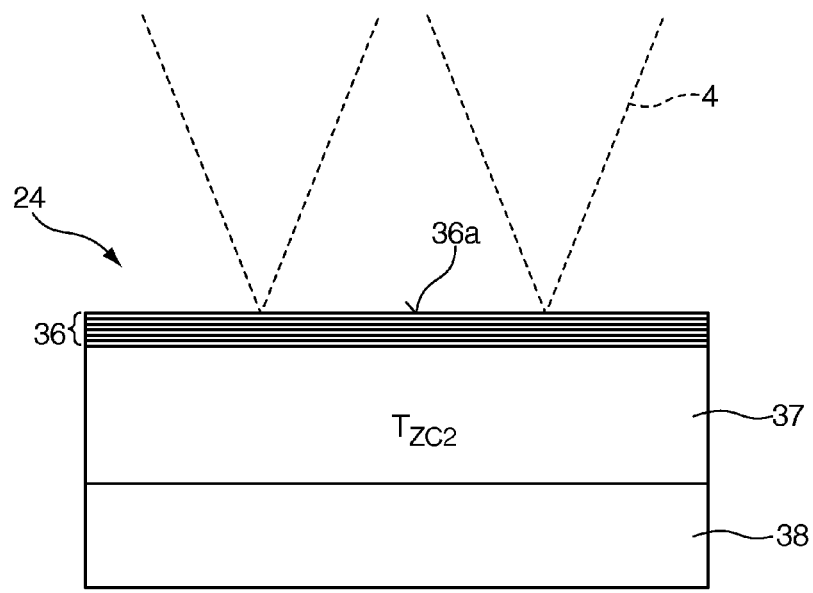

FIG. 2b shows by way of example the fourth optical element 24 of the projection lens 20, which, like the optical element 22 from FIG. 2a, has a reflective coating 36 having a reflective surface 36a and a carrier 38, on which no heating device is provided in the present example. The optical element 24 from FIG. 2b differs from the optical element 22 from FIG. 2a in that the $TiO_2$ proportion of the quartz glass substrate 37 deviates from the $TiO_2$ proportion of the quartz glass of the substrate 32 of the optical element 22 from FIG. 2a. In the present example, the $TiO_2$ proportion of the substrate 37 of the optical element 24 from FIG. 2b is approximately 15% by weight. The zero crossing temperature $T_{ZC2}$ corresponds to the working temperature $T_{A2}$ of the optical element 24, which, in the present example, is at room temperature of 22° C., as can be discerned in FIG. 3b. The zero crossing temperatures of the substrates 32, 37 of the optical elements 22, 24 from FIG. 2a and FIG. 2b, respectively, therefore differ by $|T_{ZC2}-T_{ZC1}|=11$ K.

Figure 3B:
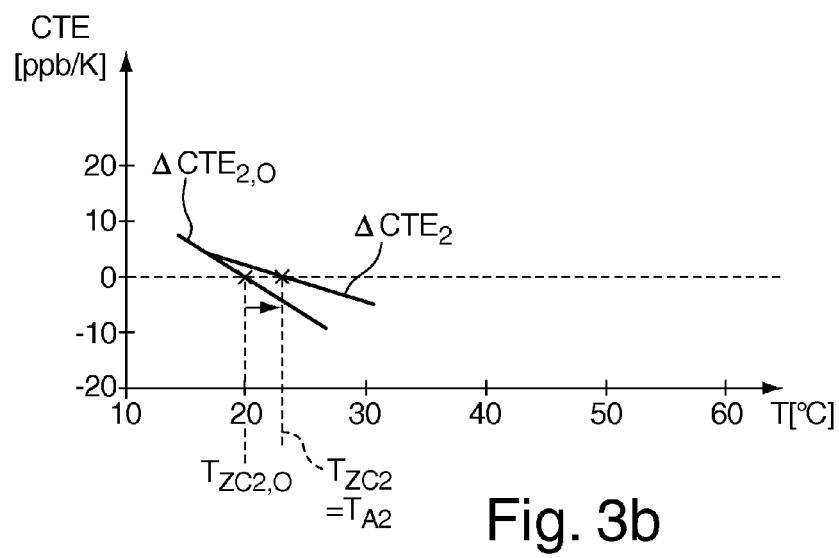

As is likewise illustrated in FIG. 3b, the gradient $\Delta CTE_2$ of the coefficient of thermal expansion of the substrate 37 of the optical element 24 from FIG. 2b has a negative sign and therefore differs from the positive sign of the gradient $\Delta CTE_1$ of the coefficient of thermal expansion CTE of the optical element 22 from FIG. 2a. As in the case of the optical element 22 from FIG. 2a, the absolute value of the gradient $\Delta CTE_2$ of the coefficient of thermal expansion of the optical element 24 from FIG. 2b is less than 1.0 ppb/$K^2$, preferably less than 0.5 ppb/$K^2$, in particular less than 0.2 ppb/$K^2$.

The method described below can be carried out for configuring or for providing the optical elements 21 to 24 for the projection lens 20:

Firstly, two material batches (or groups of substrates, in the form of $TiO_2$-doped quartz glass blanks ("boules") are provided, which have a different zero crossing temperature $T_{ZC1,O}$, $T_{ZC2,O}$. In addition, the two batches differ in terms of a different sign of the gradient $\Delta CTE_{1,O}$, $\Delta CTE_{2,O}$ of the respective coefficient of thermal expansion at the respective zero crossing temperature $T_{ZC1,O}$, $T_{ZC2,O}$. Such a different zero crossing temperature $T_{ZC1,O}$, $T_{ZC2,0}$ or a corresponding gradient $\Delta CTE_{1,O}$, $\Delta CTE_{2,O}$ can be achieved through the choice of a different $TiO_2$ proportion in the respective quartz glass blank during glass production, wherein a negative gradient of the coefficient of thermal expansion is typically established given a $TiO_2$ proportion of more than 12% by weight. In particular, in order to produce a negative gradient, it is possible to adopt the procedure as in DE 21 40 931 C3 cited in the introduction and, e.g. during the production of the quartz glass blank, to carry out heat treatment at an initial temperature of approximately 960° C. and a cooling rate of approximately 3° C./h to approximately 700° C.

In the present example, a value of $T_{ZC1,O}=40°$ C. was chosen as the zero crossing temperature $T_{ZC1,O}$ of a first material batch, from which the optical element 22 from FIG. 2a was produced. This value is just above the working temperatures typically used during the operation of the optical elements 21 to 24 of the projection lens 20. In the present example, the gradient $\Delta CTE_{1,O}$ of the coefficient of thermal expansion of the first material batch is approximately +1.6 ppb/K². In order to produce the optical element 22 from FIG. 2a, a sufficiently large partial volume is cut out from the quartz glass block, provided that the quartz glass block has not already been divided in a previous step into a group of substrates or volume elements that are large enough to produce substrates for EUV mirrors therefrom.

The quartz glass volume cut out is firstly adapted to the geometry and size of the optical element 22 from FIG. 2a and subsequently subjected to a heat treatment step which, proceeding from a holding temperature of 1000° C., at which the quartz glass volume cut out is held for at least 40 hours, is effected at a slow cooling rate, which is typically, above 500° C., approximately 0.1-5° C./h. In this case, the zero crossing temperature decreases from the value $T_{ZC1,O}=42°$ C. of the entire first material batch to the desired value $T_{ZC1}=33°$ C., which corresponds to the working temperature $T_{A1}$ of the optical element 22 from FIG. 2a. At the same time, the gradient $\Delta CTE_{1,O}$ of the coefficient of thermal expansion decreases, such that said gradient at the working temperature $T_{A1}$ of 33° C. is less than +1.0 ppb/K². The duration of the heat treatment step or the cooling rate and the initial temperature during heat treatment can be adapted such that a greatest possible approximation to the desired zero crossing temperature $T_{ZC1}=T_{A1}$ or a smallest possible absolute value of the gradient $\Delta CTE_{1,O}$ is achieved. A plurality of heat treatment steps may possibly be necessary for adapting the zero crossing temperature to the working temperature $T_{A1}$, the gradient of the coefficient of thermal expansion typically varying only slightly.

For adapting the quartz glass material of the second batch, which has a zero crossing temperature $T_{ZC2,O}$ of 20° C. (cf. FIG. 3b), to the desired properties at the working temperature $T_{A2}=22°$ C. of the optical element 24 from FIG. 2b, an analogous procedure can be adopted, i.e. a quartz glass volume adapted to the final geometry can be subjected to a heat treatment process in order to reduce the absolute value of the (negative) gradient of the coefficient of thermal expansion. The heat treatment can, by way of example, start at an initial temperature of between approximately 750° C. and approximately 850° C. and be carried out with a cooling rate of approximately 1° C. to approximately 2° C./h. The exact parameters during heat treatment should be chosen such that the remaining (negative) gradient after heat treatment has an absolute value of less than 1.0 ppb/K², as is shown in FIG. 3b. The zero crossing temperature of the substrate 37 varies only slightly (if at all) during this heat treatment process. In the case of the example shown in FIG. 3b, this results in a slight shift in the zero crossing temperature $T_{ZC2,O}$ of the second material batch by approximately 2° C. to the working temperature $T_{A2}=22°$ C. of the optical element 24 from FIG. 2b. Depending on the choice of the other production parameters, this shift can also be slightly different, or may not occur at all.

The selection of one of the two material batches or groups of substrates is typically effected in a manner dependent on the position of the respective optical element 21 to 24 in the projection lens 20, to be precise for the following reason: the position influences the working temperature of the optical element 21 to 24 since in general only approximately 60-70% of the radiation power of the incident radiation is reflected by a respective optical element 21 to 24 and the respectively impinging radiation power therefore decreases from the first optical element 21 to the fourth optical element 24.

In particular, for correction or for reduction of aberrations of the projection lens 20, it has proved to be advantageous if at least two of the optical elements 21 to 24 have an opposite sign of the gradient of the coefficient of thermal expansion at the respective zero crossing temperature. More than two groups of material batches can also serve as starting materials for the optical elements of the projection lens 20. However, since the zero crossing temperature is adjustable within certain limits, in general only two material batches are required, which can be used to realize the desired property of a different sign of the gradient of the coefficient of thermal expansion. The method described above can also be carried out in other optical arrangements designed for operation with EUV radiation, for example in an EUV mask metrology system. As an alternative to producing a different sign of the gradient of the coefficient of thermal expansion at the zero crossing temperature of the two material batches, both material batches at the respective zero crossing temperature can also have a negative gradient of the coefficient of thermal expansion.

What is claimed is:

1. Optical arrangement for extreme-ultraviolet (EUV) lithography, comprising:
a first optical element, which comprises a reflective surface and a first substrate composed of $TiO_2$-doped quartz glass, which has a temperature-dependent coefficient of thermal expansion having a zero crossing at a first zero crossing temperature ($T_{ZC1}$), and
a second optical element, which comprises a reflective surface and a second substrate composed of $TiO_2$-doped quartz glass, which has a temperature-dependent coefficient of thermal expansion having a zero crossing at a second zero crossing temperature ($T_{ZC2}$), which is different from the first, wherein at least one of:
a gradient ($\Delta CTE_1$) of the coefficient of thermal expansion of the first substrate at the first zero crossing temperature ($T_{ZC1}$) and a gradient ($\Delta CTE_2$) of the coefficient of thermal expansion of the second substrate at the second zero crossing temperature ($T_{ZC2}$) has a negative sign.

2. Optical arrangement according to claim 1, wherein the gradient ($\Delta CTE_1$) of the coefficient of thermal expansion of the first substrate at the first zero crossing temperature ($T_{ZC1}$) and the gradient ($\Delta CTE_2$) of the coefficient of thermal expansion of the second substrate at the second zero crossing temperature ($T_{ZC2}$) differ in terms of sign.

3. Optical arrangement according to claim 1, wherein at least one of: the absolute value of the gradient ($\Delta CTE_1$) of the coefficient of thermal expansion of the first substrate at the first zero crossing temperature ($T_{ZC1}$) and the absolute value of the gradient ($\Delta CTE_2$) of the coefficient of thermal expansion of the second substrate at the second zero crossing temperature ($T_{ZC2}$) is less than 1.0 ppb/K².

4. Optical arrangement according to claim 1, wherein the absolute value of the difference ($|T_{ZC2}-T_{ZC1}|$) between the first zero crossing temperature ($T_{ZC1}$) and the second zero crossing temperature ($T_{ZC2}$) is more than 6 K.

5. Optical arrangement according to claim 1, wherein the $TiO_2$ content of the first substrate differs from the $TiO_2$ content of the second substrate.

6. Optical arrangement according to claim 1, wherein the first substrate has a $TiO_2$ content of between 8% and 12%.

7. Optical arrangement according to claim 1, wherein the second substrate has a $TiO_2$ content of more than 12%.

8. Optical arrangement according to claim 1, wherein both the first and the second zero crossing temperature ($T_{ZC1}$, $T_{ZC2}$) lie in a temperature range of between 0° C. and 100° C.

9. Optical arrangement according to claim 1, wherein a reflective coating is applied to at least one of: the first and the second substrate, the reflective surface being formed at the reflective coating.

10. Optical arrangement according to claim 9, wherein at least one functional layer is fitted between at least one of: the first and the second substrate and the reflective coating.

11. Optical arrangement according to claim 1, further comprising:
    at least one heating device for heating at least one substrate, and a control device for driving the at least one heating device to set the temperature of the at least one substrate to a working temperature ($T_{A1}$).

12. Optical arrangement according to claim 11, wherein the working temperature ($T_{A1}$) deviates from the zero crossing temperature ($T_{ZC1}$) of the substrate by less than 3 K.

13. Method for configuring an optical arrangement for extreme ultraviolet (EUV) lithography, wherein the optical arrangement comprises at least two optical elements having a surface that reflects EUV radiation, and having a substrate composed of $TiO_2$-doped quartz glass, the method comprising:
    selecting a substrate for the optical elements from a first or a second group of substrates composed of $TiO_2$-doped quartz glass, wherein the first group has a temperature-dependent coefficient of thermal expansion having a zero crossing at a first zero crossing temperature ($T_{ZC1,O}$), wherein the second group has a coefficient of thermal expansion having a zero crossing at a second zero crossing temperature ($T_{ZC2,O}$), which is different from the first, and wherein at least one of: a gradient ($\Delta CTE_{1,O}$), of the coefficient of thermal expansion of the first group of substrates at the first zero crossing temperature ($T_{ZC1,O}$) and a gradient ($\Delta CTE_{2,O}$) of the coefficient of thermal expansion of the second group of substrates at the second zero crossing temperature ($T_{ZC2,O}$) has a negative sign.

14. Method according to claim 13, wherein selecting is effected in a manner dependent on the position of a respective optical element in the optical arrangement.

15. Method according to claim 13, wherein the first group of substrates at the first zero crossing temperature ($T_{ZC1,O}$) has a gradient ($\Delta CTE_{1,O}$) of the coefficient of thermal expansion whose sign differs from the gradient ($\Delta CTE_{2,O}$) of the coefficient of thermal expansion of the second group of substrates at the second zero crossing temperature ($T_{ZC2,O}$).

16. Method according to claim 13, wherein the $TiO_2$ content of the first group of substrate materials differs from the $TiO_2$ content of the second group of substrate materials.

17. Method according to claim 13, further comprising:
    performing a heat treatment of the selected substrate for at least one of: changing the zero crossing temperature ($T_{ZC1,O}$, $T_{ZC2,O}$) to a desired zero crossing temperature ($T_{ZC1}$, $T_{ZC2}$) for the optical element and reducing the gradient ($\Delta CTE_{1,O}$, $\Delta CTE_{2,O}$) of the coefficient of thermal expansion to an absolute value of less than 1.0 ppb/$K^2$ at the desired zero crossing temperature ($T_{ZC1}$, $T_{ZC2}$) of the optical element.

18. Method according to claim 17, wherein the heat treatment comprises:
    heating the selected substrate to a holding temperature of at least 900° C., holding the substrate at the holding temperature for at least 40 hours, and cooling the substrate at a cooling rate of between 0.1 K/h and 2.0 K/h in a temperature range between the holding temperature and 500° C.

* * * * *